United States Patent
Prodanov

(10) Patent No.: US 6,693,469 B2
(45) Date of Patent: Feb. 17, 2004

(54) BUFFER INTERFACE ARCHITECTURE

(75) Inventor: Vladimir I. Prodanov, New Providence, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 10/128,140

(22) Filed: Apr. 23, 2002

(65) Prior Publication Data

US 2002/0186058 A1 Dec. 12, 2002

Related U.S. Application Data

(60) Provisional application No. 60/287,674, filed on May 1, 2001.

(51) Int. Cl.[7] .................................................. H03K 3/00
(52) U.S. Cl. .................... 327/108; 327/112; 327/170; 326/56; 326/58
(58) Field of Search .................... 327/108–112, 170, 327/436, 437; 326/82, 83

(56) References Cited

U.S. PATENT DOCUMENTS

| | | | |
|---|---|---|---|
| 3,947,778 A | 3/1976 | Hsiao | 330/30 |
| 5,179,297 A | 1/1993 | Hsueh et al. | 327/537 |
| 5,304,867 A | 4/1994 | Morris | 327/333 |
| 5,381,062 A | 1/1995 | Morris | 326/68 |
| 5,418,476 A | 5/1995 | Strauss | 326/58 |
| 5,504,450 A | 4/1996 | McPartland | 327/437 |
| 5,548,241 A | 8/1996 | McClure | 327/538 |
| 5,576,656 A | 11/1996 | McClure | 327/538 |
| 5,581,209 A | 12/1996 | McClure | 327/538 |
| 5,589,794 A | 12/1996 | McClure | 327/538 |
| 5,594,373 A | 1/1997 | McClure | 327/108 |
| 5,596,297 A | 1/1997 | McClure et al. | 327/538 |
| 5,598,122 A | 1/1997 | McClure | 327/538 |
| 5,663,917 A | 9/1997 | Oka et al. | 365/226 |
| 5,808,480 A | 9/1998 | Morris | 326/81 |
| 5,864,243 A | 1/1999 | Chen et al. | 326/58 |
| 5,926,056 A | 7/1999 | Morris et al. | 327/333 |
| 5,933,027 A | 8/1999 | Morris et al. | 326/81 |
| 5,952,848 A | 9/1999 | Morris | 326/81 |
| 5,973,534 A | 10/1999 | Singh | 327/309 |
| 6,515,503 B2 * | 2/2003 | Griffin et al. | 326/30 |

OTHER PUBLICATIONS

M. Pelgrom and E. Dijkmans, "A 3/5V compatible I/O Buffer," IEEE Journal of Solid–State Circuits, vol. 30, No. 7, Jul. 1995, p.p. 823–825.

G. Singh and R. Salem, "High–Voltage–Tolerant I/O Buffers with Low–Voltage CMOS Process," IEEE Journal of Solid–State Circuits, vol. 34, No. 11, Nov. 1999, p.p. 1512–1525.

L.T. Clark, A High–Voltage Output Buffer Fabricated on a 2V CMOS Technology, 1999 Symposium on VLSI Circuits Digest of Technical Papers, p.p. 61–62.

* cited by examiner

*Primary Examiner*—Kenneth B. Wells
(74) *Attorney, Agent, or Firm*—Ozer M. N. Teitelbaum

(57) ABSTRACT

An up to 3× breakdown voltage tristate capable integrated circuit CMOS buffer includes a level shifter circuit and a driver circuit. The driver stage includes a series connected n-channel and p-channel cascode stacks, each including at least three transistors. Dynamic gate biasing is provided for the third n-channel and p-channel cascode transistors to prevent voltage overstress of the cascode transistors. The level shifter circuit includes at least one pseudo N-MOS inverter including an input transistor, a protective cascode stack including at least one n-channel cascode transistor, and a load transistor. The level shifter provides at least one voltage shifted input signal to the driver.

21 Claims, 12 Drawing Sheets

20

30

100

300

200

400

500

BUFFER INTERFACE ARCHITECTURE

CROSS-REFERENCE TO RELATED APPLICATIONS

This application claims priority from U.S. provisional application Ser. No. 60/287,674, filed May 1, 2001 and entitled "Buffer Interface Architecture."

FIELD OF THE INVENTION

The present invention relates to integrated circuits, generally, and more specifically to a buffer for interfacing a low-voltage technology with a relatively high-voltage technology.

DESCRIPTION OF THE RELATED ART

Advances in the semiconductor arts have driven devices to decreasing sizes operating at increasing speeds. This continuous effort to maximize the performance of integrated circuits ("ICs") has produced several additional benefits, including decreased operating voltages and reductions in power consumption.

As MOS technology scales below 0.2 μm, acceptable supply voltages have lowered below the previous 3.3V and 5V standards. As lower and lower operating voltage IC technology is developed and commercialized, however, a distinct problem has arisen. Mostly because of economic reasons, electronic systems often use ICs that span several technology generations, each generation having different supply voltage requirements. The ability to interface newer low power ICs with their predecessors where each IC has a different range of operating voltages is of concern, particularly as it relates to metal oxide semiconductors ("MOS"). Interfacing an older higher operating voltage IC with a lower operating voltage technology may cause reliability issues and/or temporary or even permanent damage. For example, the buffer circuits of a 1.5V IC can neither provide nor sustain (when in a high impedance state) a 3.3V drive.

To overcome this interface problem, several solutions have been proposed. One approach entails the development of MOS devices capable of handling both low and high voltages on the same semiconductor substrate. While this "dual supply" approach is simple in circuit implementation, presently, it is substantially more expensive than the traditionally known MOS technology because of the additional processing steps required to fabricate the high-voltage devices. Currently, many 0.2 μm technologies utilize this "dual supply" approach.

Alternatively, several buffer interface architectures are also known in the art for providing high voltage drive capability using low voltage MOS technology. Using this methodology, the incremental costs associated with the additional circuitry required to realize an interface having high voltage drive capability while implemented in low voltage MOS technology are negligible.

Prior approaches to high-voltage drive buffers with low-voltage transistors (HVB/LVT) can be classified into two basic groups. FIG. 1A illustrates a circuit with both high-voltage tolerance and high-voltage drive. Such a circuit is proposed in U.S. Pat. No. 5,663,917 to Oka et al., the entirety of which is hereby incorporated by reference herein. FIG. 1B illustrates a circuit with high-voltage tolerance and low-voltage drive, such as may be found in M. Pelgrom and E. Dijkmans, "A ⅗V compatible I/O Buffer," IEEE J. of Solid-State Circuits, vol. 30, No. 7, p.p. 823–825, July, 1995, the entirety of which is hereby incorporated by reference herein.

For purposes of circuit 10 of FIG. 1A, it is assumed that the breakdown voltage of the transistors used in the circuit is only slightly higher than ½ $V_{HIGH}$—the voltage swing of the input signal. The circuit 10 of FIG. 1A includes a pad driver 12 which includes p-channel and n-channel cascode stacks, which include MOS devices $P_1$, $P_2$ and $N_1$, $N_2$, respectively. The cascode transistors $P_2$ and $N_2$ allow the output at pad node 14 to traverse between 0V and $V_{HIGH}$ while the $V_{GS}$'s (voltage gate to source) and $V_{GD}$'s (voltage gate to drain) of all four transistors $P_1$, $P_2$, $N_1$, $N_2$ remain lower than ½ $V_{HIGH}$, and thus lower than the breakdown voltage of the transistors. The voltage capability of the pad driver 12, therefore, is two times larger than the voltage capability of the MOSFETs used in the driver. Such a circuit may be referred to as a "2× driver."

For proper operation, the cascode pad driver 12 requires two in-phase input signals at nodes 18 and 20. Both signals must have a voltage swing that does not exceed ½ $V_{HIGH}$ in order to avoid exceeding the voltage capability of the transistors used therein. These signals are provided from the level shifter 16 to the driver 12 through two conventional inverter chains. The level shifter 16 takes a 0 to ½ $V_{HIGH}$ swing input data signal and produces a data signal that swings between ½ $V_{HIGH}$ and $V_{HIGH}$ at node 18. Naturally, the level shifter 16 should be implemented in such a way that none of its transistors experience voltage overstress.

Unlike the circuit 10 of FIG. 1A, the circuit 20 of FIG. 1B is a high voltage buffer with low voltage transistors that is biased from a lower supply voltage ½ $V_{HIGH}$ and is characterized by high voltage tolerance but low voltage drive. As a result, its output drive is only between 0 and ½ $V_{HIGH}$. The structure, however, allows the pad voltage to exceed the supply voltage when the buffer is in the tristate mode, i.e., the circuit can be driven by a voltage of approximately $V_{HIGH}$ without damaging the components. The circuit, therefore, may be characterized as having a "2× tolerance." The circuit 10 of FIG. 1A may also be characterized as a "2× tolerance" circuit.

Three problems are eliminated to achieve the 2× tolerance of the circuit 20: (a) $V_{DG}$ (voltage drain to gate) overstress of the n-channel transistor $N_1$; (b) conduction of the p-channel transistor $P_1$ in tristate mode when the output node exceeds the supply voltage by approximately a threshold voltage; and (c) forward biasing of the drain-bulk p-n junction of the p-channel transistor $P_1$ when the output sufficiently exceeds the supply voltage. The first problem is resolved by using an n-channel cascode—$N_2$—while the second and the third problems are eliminated by using dynamic gate and bulk biasing (conceptually illustrated using two pairs of switches).

Recently, two HVB/LVT's with beyond-2× voltage capabilities have been reported. A first circuit has a 3.3V drive and 5V tolerance using 2V transistors and is proposed in L. Clark, "High-Voltage Output Buffer Fabricated on a 2V CMOS Technology," Digest of Technical Papers, 1999 VLSI Symposium, p.p. 61–62. A circuit that extends the stress free range of a cascode stack beyond the difference between supply and ground by approximately one threshold voltage is proposed in G. Singh and R. Salem, "High-Voltage-Tolerant I/O Buffers with Low-Voltage CMOS Process," IEEE J. of Solid-State Circuits, vol. 34, No. 11, p.p. 1512–1525, November 1999. Both circuits use dynamic gate biasing.

While the above referenced circuits address some of the issues involved with interfacing an older higher operating voltage IC with a lower operating voltage technology, the circuits possess significant long term shortcomings. Presently, there is a movement within the semiconductor industry to migrate to sub-0.2 μm sizes towards 0.16 μm, and even 0.13 μm technology powered by sub-1.5V sources. It is expected that within the next four years, the supply voltages may even be in the sub-1V range. As the industry moves below the sub-0.2 μm area and the technologies is powered by sub-1.5V sources, interface buffers will be required to handle greater than the 2× multiples of the known art in order to function with older 0.24–0.35 μm powered devices. Thus, the known art is limited as a long term solution due to the migration towards increasingly smaller MOS transistor technologies in view of the continuing commercial viability of older IC components operating at voltages more than twice that of the breakdown voltages of the smaller devices.

As such, there is a need for an improved output buffer capable of interfacing at least two ICs having operating voltages which are multiples equal to or greater than 2× and which provides no gate-to-source, gate-to-drain, and drain-to-source stresses while providing at least 2× tolerance. Still further, there is a need for a tristate capable high voltage buffer implemented with low voltage transistors that approaches 3× voltage capabilities or better.

SUMMARY OF THE INVENTION

An integrated circuit includes an output buffer having a maximum voltage that approximates the highest voltage $V_{MAX}$ applicable across at least one pair of nodes of a transistor. The output buffer is capable of delivering an output signal signal having a voltage swing $V_{HIGH}$ of up to about three times the magnitude of $V_{MAX}$. The output buffer includes at least a first and a second transistor cascode stack, each of the stacks having a driver transistor and at least one cascode transistor. The output buffer also includes a biasing circuit for biasing at least one of the cascode transistors of each of the cascode stacks in response to said output signal such that the magnitude of the voltage applicable across each pair of nodes of each transistor in each cascode stack is less than or equal to $V_{MAX}$.

The buffer may be utilized to provide a tristate capable buffer circuit with up to 3× voltage capabilities, including 3× drive and 3× tolerance.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1A:
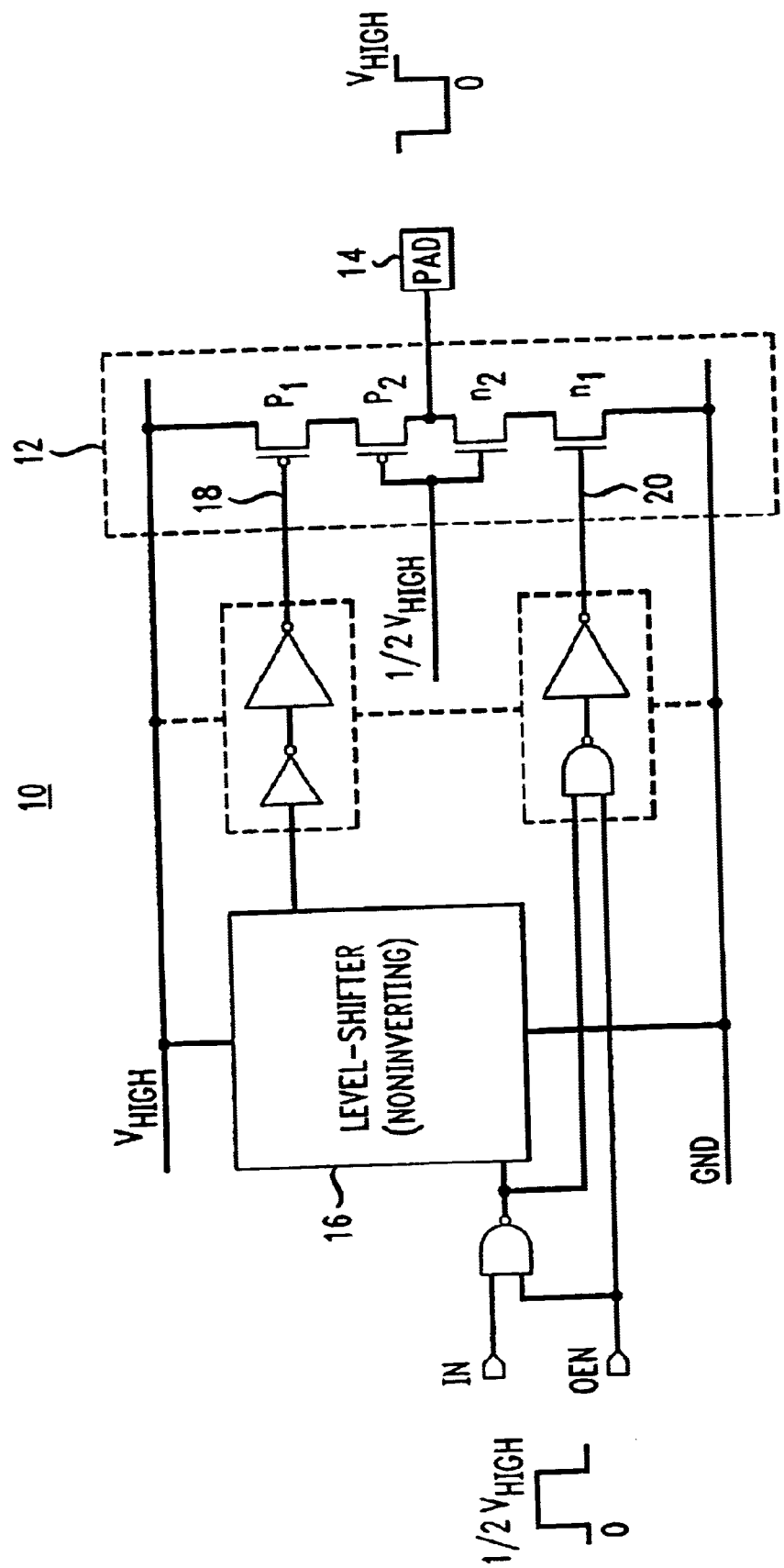
FIG. 1A is a circuit diagram of a known high voltage tolerance and high voltage driver buffer interface circuit.
Figure 1B:
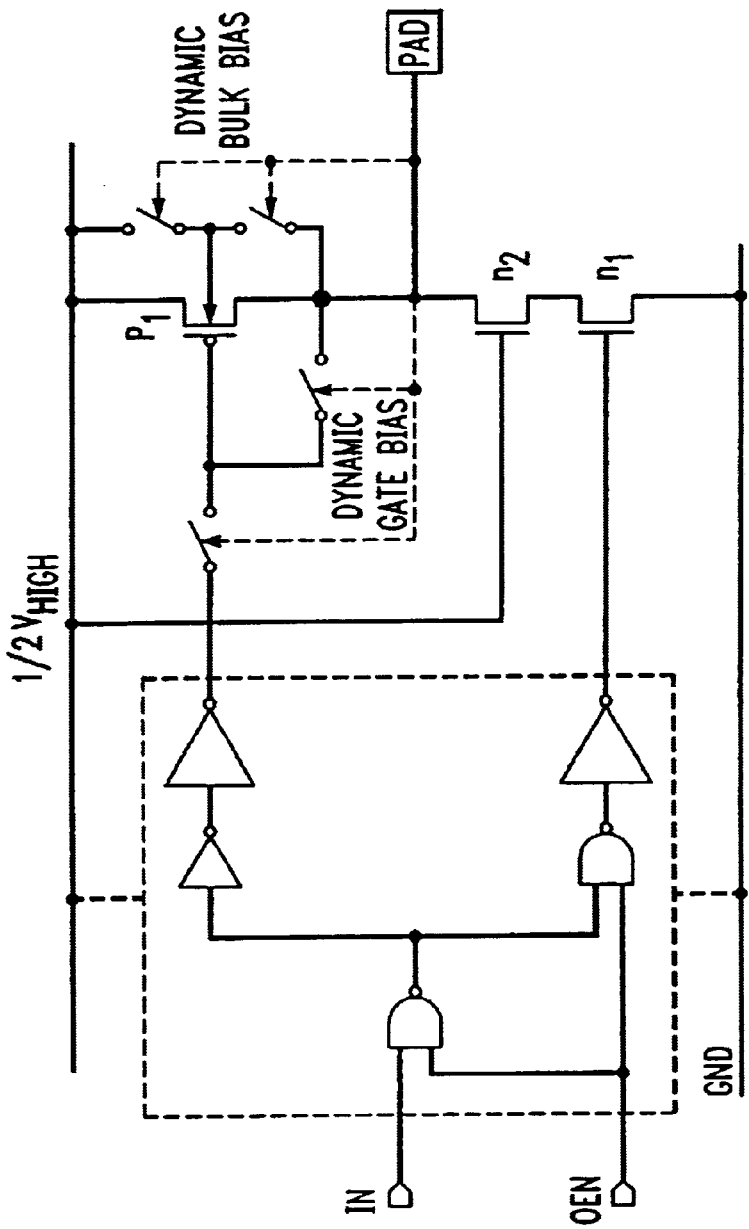
FIG. 1B is a circuit diagram of a known high voltage tolerance and low voltage driver buffer interface circuit.
Figure 2A:
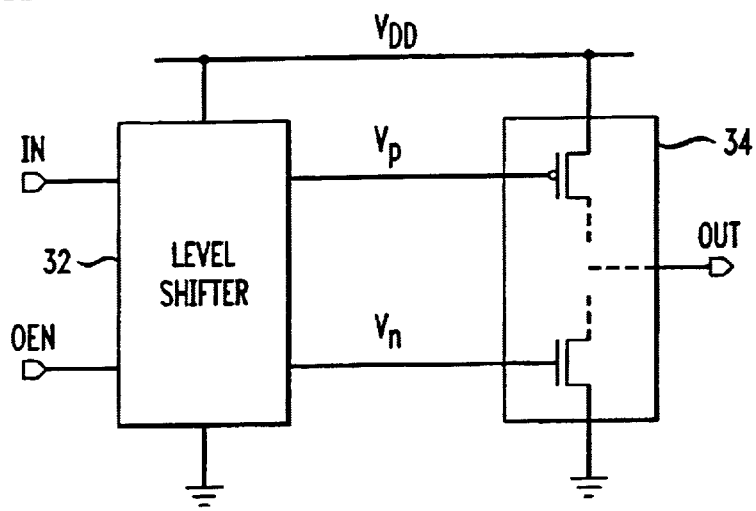
FIGS. 2A–2C are a schematic representation of a tristate capable high voltage buffer and accompanying active mode and tristate mode waveforms.
Figure 2B:
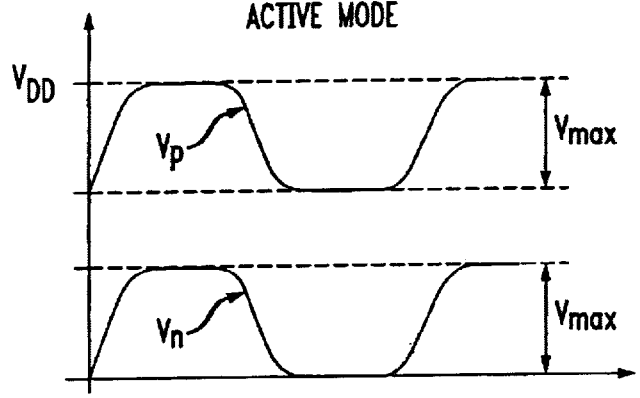
Figure 2C:
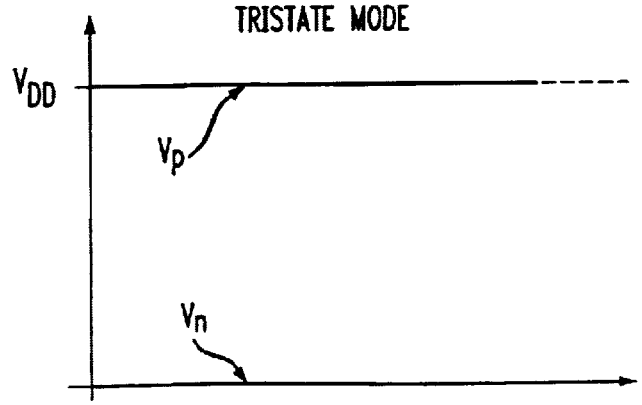

FIG. 2A is a conceptual diagram of a tristate capable CMOS buffer 30 for interfacing a low supply voltage IC chip and a high supply voltage IC chip. The buffer 30 receives an input data signal from the low voltage supply at an input and produces an output data signal which corresponds to the input data signal but has a voltage swing between ground and the higher supply voltage $V_{DD}$. The buffer 30 includes a level shifter 32 and a driver stage 34. The level shifter produces data waveforms $V_p$ and $V_n$ shown in FIGS. 2B and 2C, depending upon whether the circuit is operated in the "Active Mode" or the "Tristate Mode." As is conventional, the tristate mode is enabled via the OEN (output enable) input. In the "Active Mode," $V_n$ is typically the input data signal and $V_p$ corresponds to $V_n$ with a DC offset as shown in FIG. 2B. It is assumed, but not required, that the input data signal received from the low operating voltage IC has a voltage swing with a peak of $V_{MAX}$, $V_{max}$ approaching the maximum voltage a transistor in the buffer circuitry can withstand, i.e. $/V_{GS}/$, $/V_{GD}/$, and $/V_{DS}/ \leq V_{MAX}$.

Figure 3B:
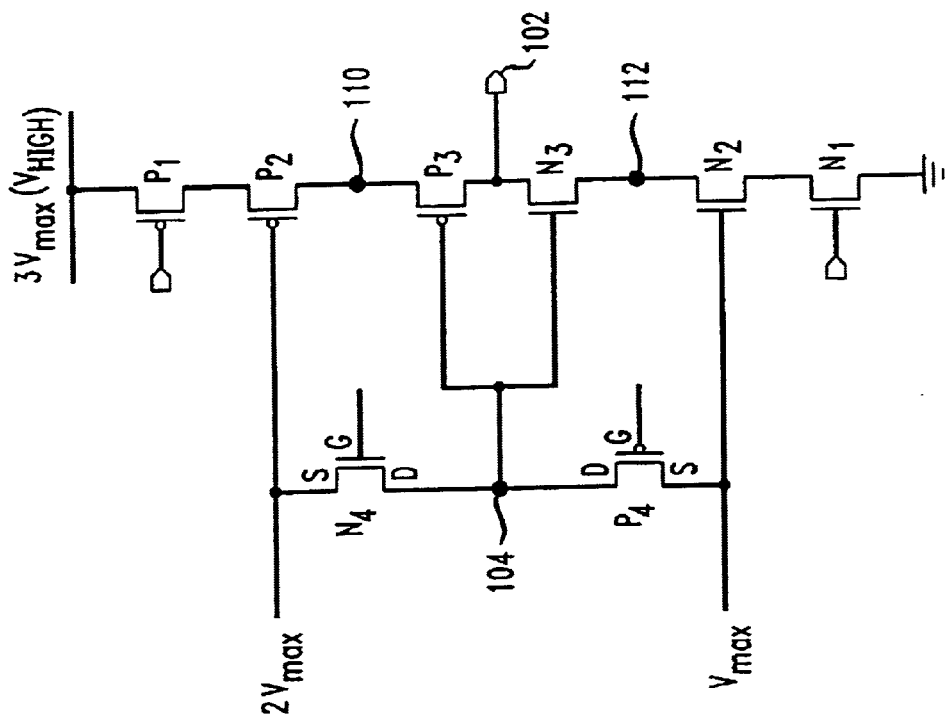
FIGS. 3A–3F are circuit diagrams of an exemplary driver for a 3× tristate capable buffer.
Figure 3A:
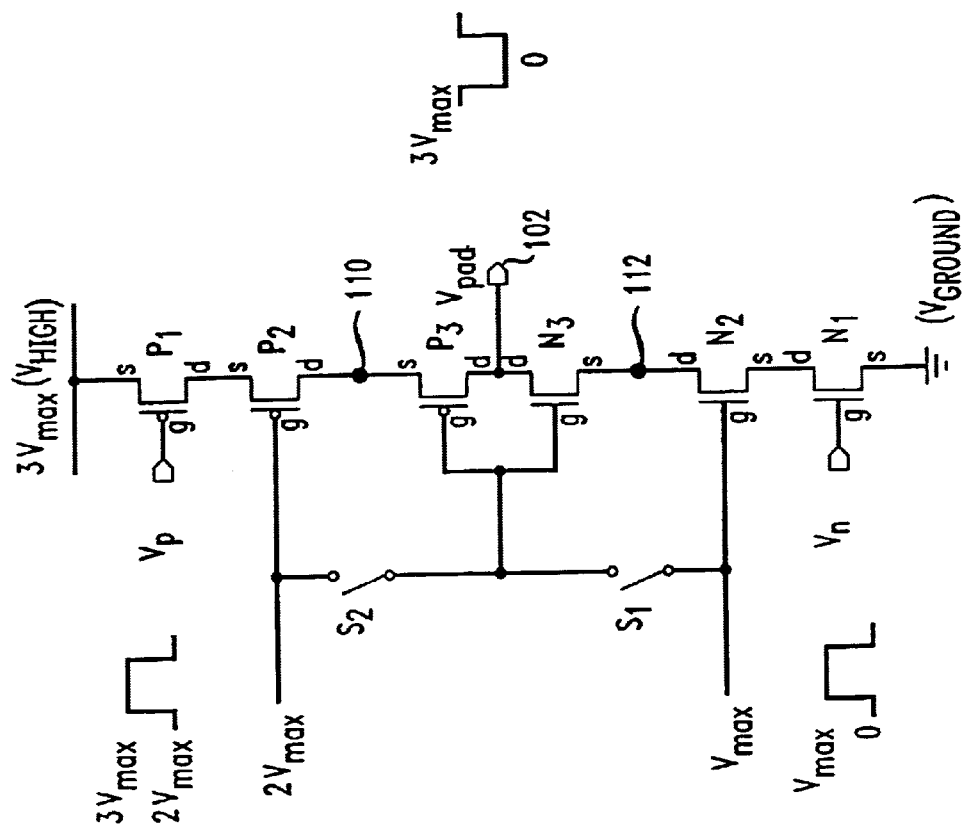

FIG. 3A is a conceptual schematic of an exemplary embodiment of a pad driver 100 having stress-free range of 3×, i.e., the driver 100 is capable of driving an output signal $V_{pad}$ at output node 102 having a voltage swing $V_{HIGH}$ which is up to approximately three times the break-down voltage of any transistor used in the driver 100. Driver 100 includes a p-channel cascode stack and an n-channel cascode stack connected in series at output node 102. The p-channel cascode stack includes at least three p-channel MOS transistors $P_1$, $P_2$, $P_3$ connected in series between the supply voltage $V_{HIGH}$ and the output node 102. The n-channel cascode stack includes at least three n-channel MOS transistors $N_1$, $N_2$, $N_3$ connected in series between the output node 102 and a relative ground $V_{GROUND}$.

The gate terminal of $N_1$ is coupled to an input data signal $V_n$ (FIG. 2A) and the gate terminal of $P_1$ is coupled to a level shifted data signal $V_p$ (FIG. 2A). These signals may be supplied by a level shifter circuit. The gate terminal of n-channel transistor $N_2$ is coupled to a first constant voltage such that the difference between the first constant voltage and $V_{GROUND}$ does not exceed $V_{MAX}$. For a true 3× buffer, this first constant voltage value equals approximately $V_{MAX}$ as shown in FIG. 3A. The gate terminal of p-channel transistor $P_2$ is coupled to a second constant voltage such that the difference between $V_{HIGH}$ and the second constant voltage does not exceed $V_{MAX}$. For a true 3× buffer, the second constant voltage is set to $2V_{max}$ as shown in FIG. 3A. The first constant voltage may be obtained from the low voltage supply IC. The second constant voltage may be generated internally within the buffer by conventional techniques.

In an exemplary driver 100, the pad voltage at output node 102 controls switches $S_1$ and $S_2$, which thereby provide dynamic gate biasing for cascode transistors $P_3$ and $N_3$. None of the six transistors $N_1$, $N_2$, $N_3$, $P_1$, $P_2$, and $P_3$ experience $V_{GS}$ or $V_{DG}$ voltage overstress if the following conditions are satisfied: (1) $S_1$ is closed when $V_{pad}$ falls below the first constant voltage (e.g., $V_{MAX}$); (2) $S_2$ is closed when $V_{pad}$ rises above the second constant voltage (e.g., $2V_{max}$); and (3) $S_1$ and $S_2$ maintain the gate voltage of $N_3$ and $P_3$ at or between the first or second constant voltages when $V_{pad}$ is at or between the first and second constant voltages. Of course, both $S_1$ and $S_2$ are never both closed.

The fact that $S_1$ must be closed or "on" when its control voltage (i.e., $V_{pad}$) is lower than the switch terminal voltages suggests that $S_1$ should be implemented using a p-channel transistor. $S_2$ on the other hand should be implemented using n-channel transistor because it must be closed or "on" when its control voltage is higher than its terminal voltages. This configuration is shown in FIG. 3B with the addition of n-channel transistor $N_4$ and p-channel transistor $P_4$. The drain terminals of each transistor are coupled at node 104 to the gate terminals of transistors $N_3$ and $P_3$.

The gates of both switch transistors $N_4$ and $P_4$ should be controlled by $V_{pad}$, but preferably are not directly connected to the pad node 102. A direct connection would result in voltage overstress of the switch transistors $N_4$ and $P_4$. For stress-free operation, the gate voltage of $P_4$ should follow $V_{pad}$, but it should not exceed $\frac{2}{3}V_{HIGH}$ or $2V_{max}$. Similarly, the gate voltage of $N_4$ should follow $V_{pad}$, but it should not go below $\frac{1}{3}V_{HIGH}$ or $V_{MAX}$. When the driver 100 of FIG. 3A is in tristate mode, nodes 110 and 112 have the required voltage excursions. The voltage at node 112 follows $V_{pad}$ down to $V_{GROUND}$, but it would not increase much beyond $\frac{2}{3}V_{HIGH}$–Vtn. The voltage at node 110, on the other hand, follows $V_{pad}$ to the supply rail, but it would not decrease significantly below $\frac{1}{3}V_{HIGH}$+Vtp. Note that "Vtn" is the threshold voltage of the n-channel devices, and Vtp is the threshold voltage of the p-channel devices.

A driver 100 as shown in FIG. 3B but having the gate terminals of $N_4$ and $P_4$ coupled directly to node 110 and 112, respectively, was simulated using 0.25 μm 2.5V breakdown voltage technology and a $V_{HIGH}$ of 7.5V. The driver was placed in tristate mode (i.e., both $N_1$ and $P_1$ were OFF) and the pad voltage was varied between 0 and 7.5 V. As expected, the gate-source and gate-drain voltages of all eight transistors ($N_1$–$N_4$ and $P_1$–$P_4$) remained bounded to ±2.5V (i.e., the voltages did not exceed $V_{MAX}$). In active mode, however, the voltage at node 112 is not only a function of both $V_{out}$ (i.e., $V_{pad}$) but it is also a function of the gate voltage of transistor $N_1$. Similarly, the voltage at node 110 is a function of both $V_{pad}$ and the gate voltage of transistor $P_1$. As a result, immediately after each input transition, both $P_4$ ($S_1$) and $N_4$ ($S_2$) are ON and conducting a large "shot-trough" current. More importantly, during the same time frame, the gate oxides of both $N_3$ and $P_3$ are subjected to voltage overstress. This issue is addressed in the circuit of FIG. 3C.

Figure 3D:
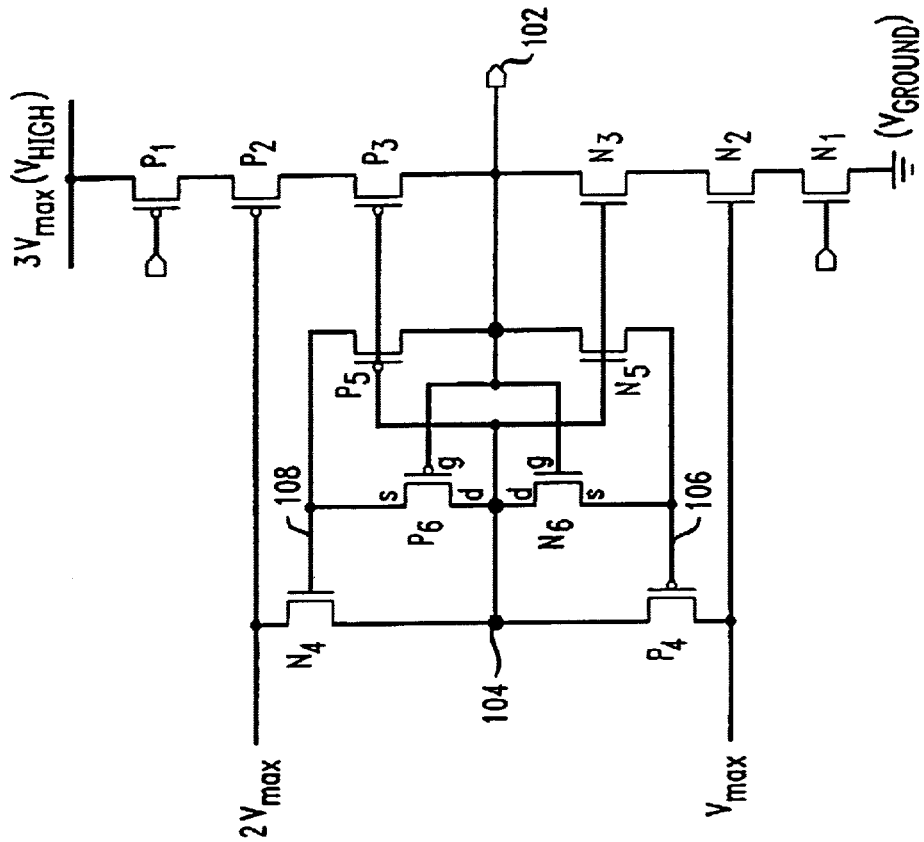
Figure 3C:
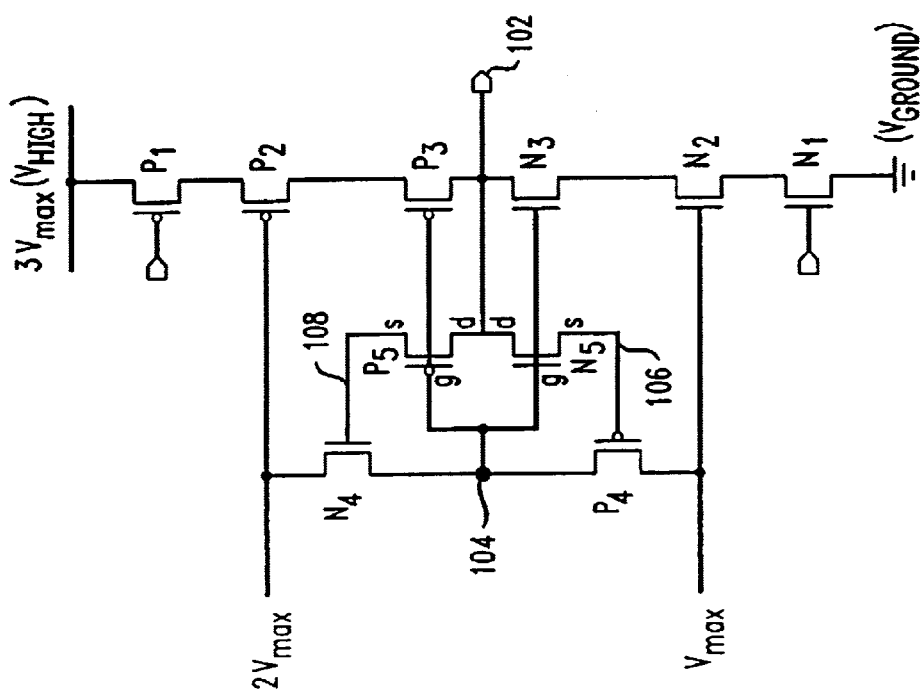

In FIG. 3C, the triple cascode is split into two separate circuits, one of which is always operated in tristate mode, and the switching transistors are shared. The controls for the switching transistors are derived from the "always-tristate" circuit. Switch transistors $P_4$ and $N_4$ respond only to changes in $V_{pad}$ at node 102 and provide dynamic protection for added transistors $N_5$ and $P_5$. Transistors $N_5$ and $P_5$ have gate terminals coupled to node 104, and drain terminals coupled to output node 102. The source terminal of $P_5$ is coupled to the gate terminal of $N_4$, and the source terminal of $N_5$ is coupled to the gate terminal of $P_4$. Since the drain and gate nodes of these two transistors $P_5$, $N_5$ are coupled respectively to the gate and drain nodes of $N_3$ and $P_3$ (also referred to as nodes 104 and 102, respectively), the switches $N_4$, $P_4$ also provide protection for $P_5$ and $N_5$. An exemplary high voltage buffer, low voltage transistor circuit is therefore achieved.

The gate-source and gate-drain voltages of all ten transistors ($N_1$–$N_5$, $P_1$–$P_5$) are always limited to ±⅓ $V_{HIGH}$ or $V_{MAX}$. Drain-source (DS) voltages of transistors $N_5$, $P_5$, $N_3$ and $P_3$ can, however, exceed $V_{MAX}$ by at least one threshold voltage (Vtn). This may be addressed by extending the length of devices in the driver, but this may not be a viable option with increasing area constraints on ICs.

In order to keep $V_{DS}$ of $N_5 \leq \frac{1}{3} V_{HIGH}$ or $V_{MAX}$, node 106 may be pulled up to $\frac{2}{3} V_{HIGH}$. This is accomplished in the exemplary circuit configurations of FIGS. 3D and 3E via transistor $N_6$. Similarly, to keep $V_{DS}$ of $P_5 \leq \frac{1}{3} V_{HIGH}$ or $V_{MAX}$ node 108 may be pulled down to ⅓ $V_{HIGH}$, which is accomplished via transistor $P_6$. Note that when activated, $N_6$ does not connect node 106 directly to ⅔ $V_{HIGH}$; instead, it connects it to node 104, which for high pad voltages acquires the desired ⅔ $V_{HIGH}$ value. Similarly, node 108 is brought down to ⅓ $V_{HIGH}$ indirectly via node 104. This feature guarantees that transistors $N_6$ and $P_6$ are not overstressed.

The final issue that should be addressed is the potential drain-source overstress of transistors $N_3$ and $P_3$. Below is a brief description of the causes of the drain-source overstress of transistor $N_3$, and a circuit approach to resolve this issue is shown in FIG. 3F. The cause of overstress of $P_3$ is analogous to that of $N_3$ and is not described.

When the pad voltage at 102 equals $V_{HIGH}$, the drain-source voltages of transistors $N_2$ and $N_3$ are as follows: $V_{DS}$ of $N_2$=⅓ $V_{HIGH}$+($V_{GS}$ of $N_2$–$V_{GS}$ of $N_3$) and $V_{DS}$ of $N_3$=⅓ $V_{HIGH}$+$V_{GS}$ of $N_3$, respectively. Immediately after input transition of the input data signal at the gate terminal of $N_1$, both $V_{GS}$ of $N_2$ and $V_{GS}$ of $N_3$ can increase so that the cascode transistors $N_2$ and $N_3$ can carry the current conducted by $N_1$. These changes alter $V_{DS}$ of $N_2$ and $V_{DS}$ of $N_3$. According to the first equation, the change in $V_{DS}$ of $N_2$ can be kept low at approximately constant and equal to ⅓ $V_{HIGH}$ by making $N_2$ and $N_3$ identical in size. The second equation reveals that $N_3$ would experience a drain-source overstress. This overstress could be prevented by connecting an additional cascode transistor $N_7$ between the drain of $N_3$ and node 102 as shown in FIG. 3F. With the addition of transistor $N_7$ in FIG. 3F to the n-channel cascode stack, the drain-source voltage of $N_3$ becomes $V_{DS}$=⅓ $V_{HIGH}$+($V_{GS}$ of $N_3$–$V_{GS}$ of $N_7$). This drain-source voltage can now be kept nearly constant and equal to ⅓ $V_{HIGH}$ by simply making $N_4$ and $N_3$ approximately equal in size. This drain-source overstress protection requires the gate terminal of $N_7$ to have a potential of $V_{HIGH}$ whenever the pad node has potential $V_{HIGH}$. The gate terminal potential of transistor $N_7$ should, however, be lowered to ⅓ $V_{HIGH}$ as pad node 102 traverses toward $V_{GROUD}$, i.e. $N_7$ requires a $V_{HIGH}$-to-⅓$V_{HIGH}$ dynamic gate biasing. Such biasing is readily available at node 108.

Similarly, the drain-source overstress of $P_3$ is eliminated by the addition of the $P_7$ cascode transistor coupled between the drain terminal of $P_3$ and output node 102. As shown in FIG. 3F, required dynamic biasing (0-to-⅔$V_{HIGH}$) is obtained by connecting the gate terminal of transistor $P_7$ to node 106.

Figure 3E:
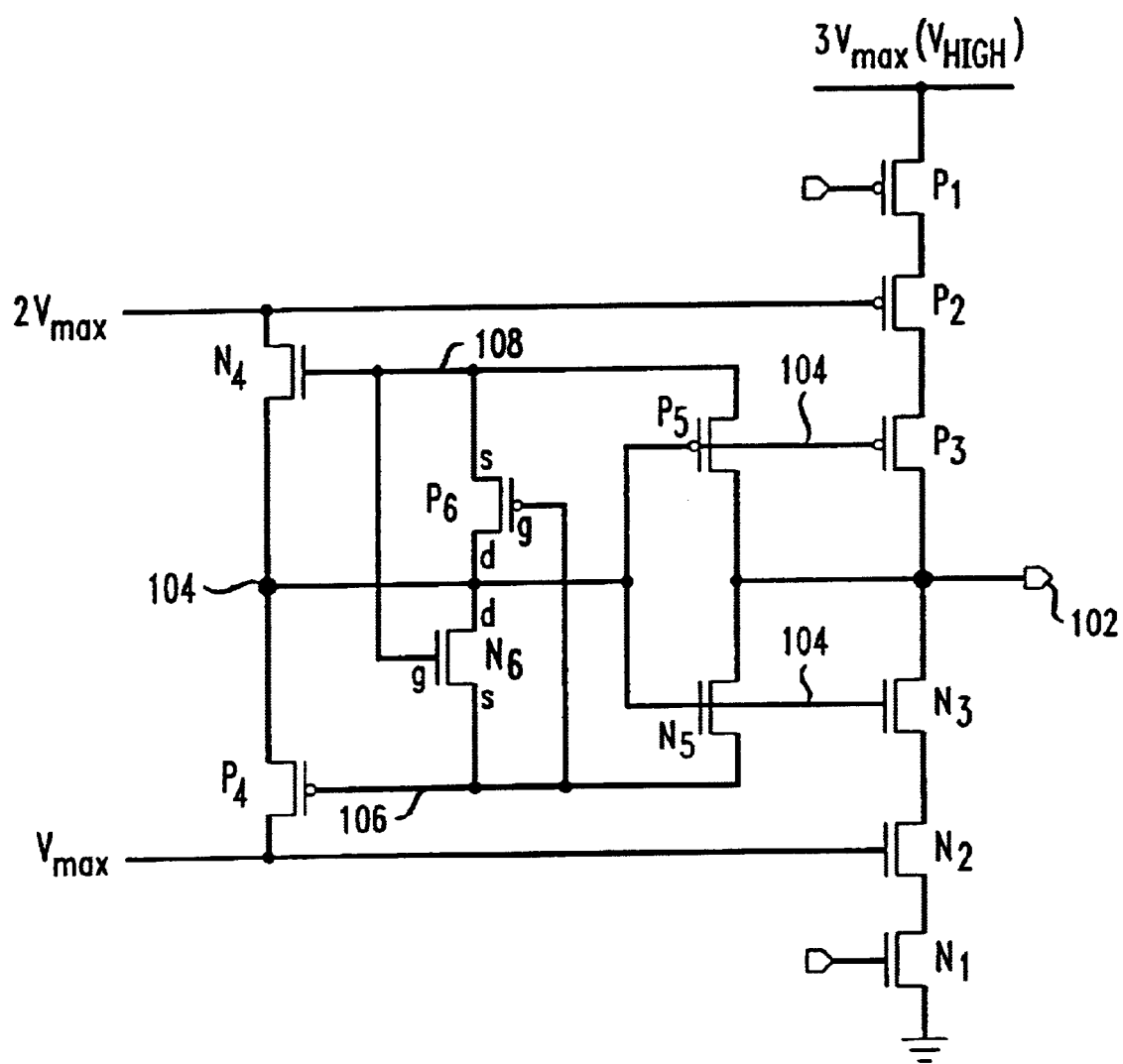
Figure 4:
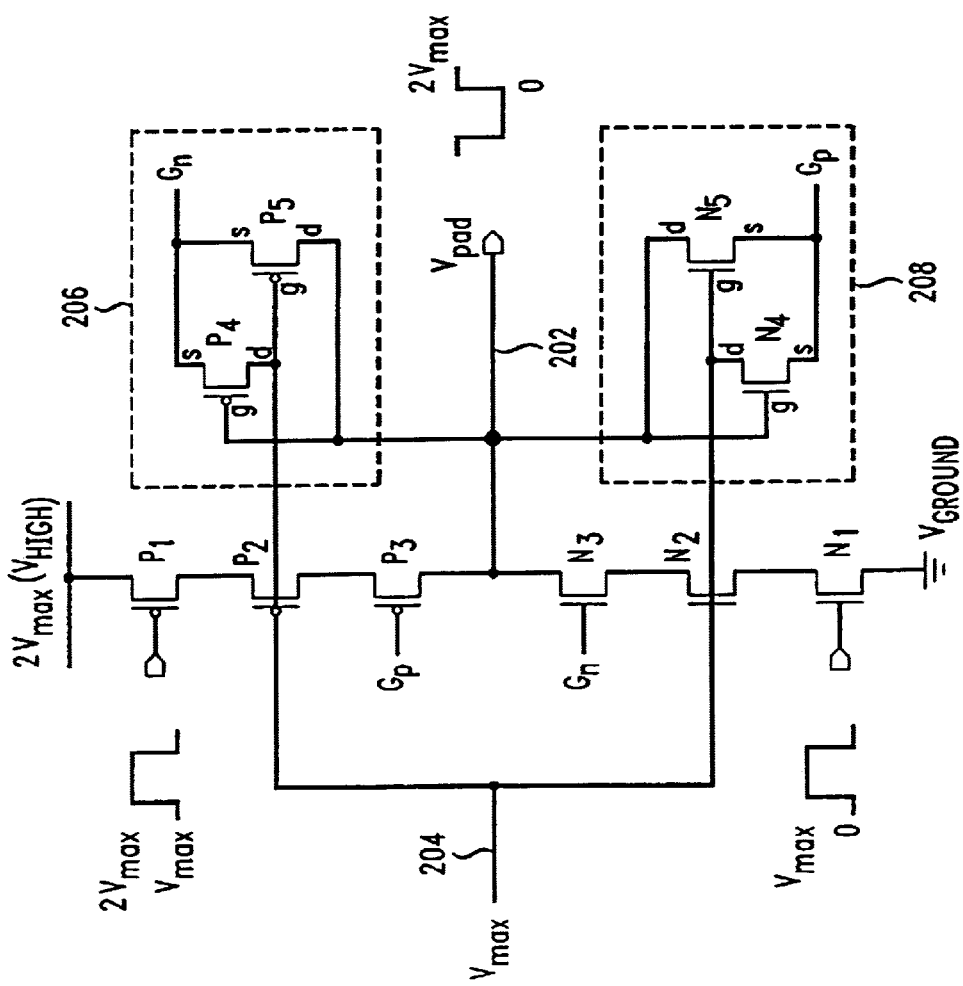
FIG. 4 is a circuit diagram of an exemplary driver for a 2× tristate capable buffer.

FIG. 4 is provided to show that the same basic approach as described above in achieving a 3× driver with no gate-source, gate-drain, and drain-source overstress may be utilized to provide a 2× driver 200 that exhibits no gate-source, gate-drain, and drain-source overstress. Note that the driver 200 of FIG. 4 includes n-channel and p-channel cascode stacks connected at an output node 202 as shown in FIGS. 3A–3E. The supply rail is set to $2V_{max}$ in the 2× driver 200 instead of $3V_{max}$. Also, the gate terminals of $P_2$ and $N_2$ are coupled to a single constant voltage at node 204 (shown as $V_{MAX}$) such that the difference between $V_{HIGH}$ and node 204 is not greater than $V_{MAX}$ and the difference between node 204 and $V_{GROUND}$ is not greater than $V_{MAX}$. The input data signal at the gate terminal of $N_3$ may have a maximum voltage swing of $V_{MAX}$, and the input data signal at the gate terminal of $P_3$ is the input data signal of $N_3$ level shifted by the DC value at node 204, i.e., the data signal traverses between $V_{MAX}$ and $2V_{max}$. Control circuits 206 and 208 provide dynamic gate biasing signals Gn and Gp to n-channel transistor $N_1$ and p-channel transistor $P_1$, respectively.

Both signals Gn and Gp are in-phase with the output signal produced at node 202 and have a voltage swing of $V_{MAX}$, with Gn traversing between $V_{MAX}$ and $V_{HIGH}$ and Gp traversing between $V_{GROUND}$ and $V_{MAX}$. To understand how the circuit 200 of FIG. 4 provides stress-free operation, the behavior of the circuit before and after input transition may be considered. Assuming that the initial condition is as follows: input is low (the gate of $N_1$ is 0V and the gate of $P_1$ is $V_{MAX}$) and the output is $V_{HIGH}$. Due to the action of the biasing circuits 206, 208, Gn and Gp respectively are $V_{HIGH}$ and $V_{MAX}$. Under these stated conditions, it can be shown that the potential difference between any two transistor terminals does not exceed $V_{MAX}$.

As the input signal at the gate terminal of $N_1$ goes high, the current carried by $N_1$ increases. In order for this current to be conducted by $N_2$ and $N_3$, the transistor source potentials of $N_2$ and $N_3$ decrease from their initial values of $V_{MAX}$–Vtn and $2V_{max}$–Vtn. If $N_2$ and $N_3$ are matched, the source decrement for both transistors is the same and $V_{DS}$ of $N_2$ remains initially constant and approximately equal to $V_{MAX}$. The drain-source voltage of $N_3$ also is less than $V_{MAX}$. As the load capacitance is being discharged, the drain voltage of $N_3$ decreases. At some point, the biasing circuit 206 is activated and it lowers the gate voltage of $N_3$ to prevent $V_{GD}$ of transistor $N_3$ from becoming to large. The output node 202 keeps discharging until it reaches $V_{GROUND}$ where it settles.

It can be shown that for output "low" or $V_{GROUND}$, and input of $V_{MAX}$, no terminal-to-terminal voltages exceed $V_{MAX}$. The circuit 200 exhibits similar behavior when the input transitions from "high" to "low" (and output transitions from "low" to "high"). During this transition, the presence of $P_3$ prevents transistor $P_2$ from developing large drain-source voltages while the control circuit 208 provides gate-source and gate-drain overstress protection for $P_3$.

Biasing circuits 206 and 208 may be implemented as shown in FIG. 4 with p-channel transistors $P_4$ and $P_5$ and n-channel transistors $N_4$ and $N_5$. P-channel transistor $P_4$ has its gate terminal coupled to $V_{pad}$ at output node 202, a drain terminal coupled to the constant voltage at node 204, and a source terminal coupled to the gate terminal of $N_3$. Transistor $P_5$ has its gate terminal coupled to node 204, a drain terminal coupled to output node 202, and its source terminal coupled to the gate terminal of $N_3$. Likewise, biasing circuit 208 may be implemented with n-channel transistor $N_4$ having its gate terminal coupled to output node 202, its source terminal coupled to the gate terminal of $P_3$, and its drain terminal coupled to the constant voltage at node 204. N-channel transistor $N_5$ has its gate terminal coupled to the constant voltage at node 204, its source terminal coupled to the gate terminal of $P_3$ and its drain terminal coupled to output node 202. The biasing circuits provide the advantage of not dissipating static power.

Figure 5A:
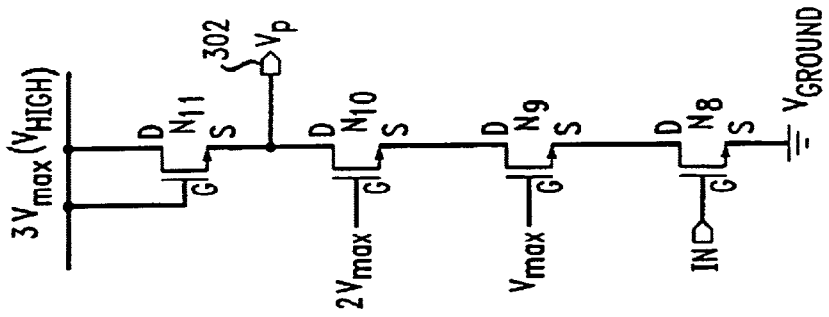
FIGS. 5A–5C are circuit diagrams of an exemplary level shifter circuit for a 3× tristate capable buffer.
Figure 5B:
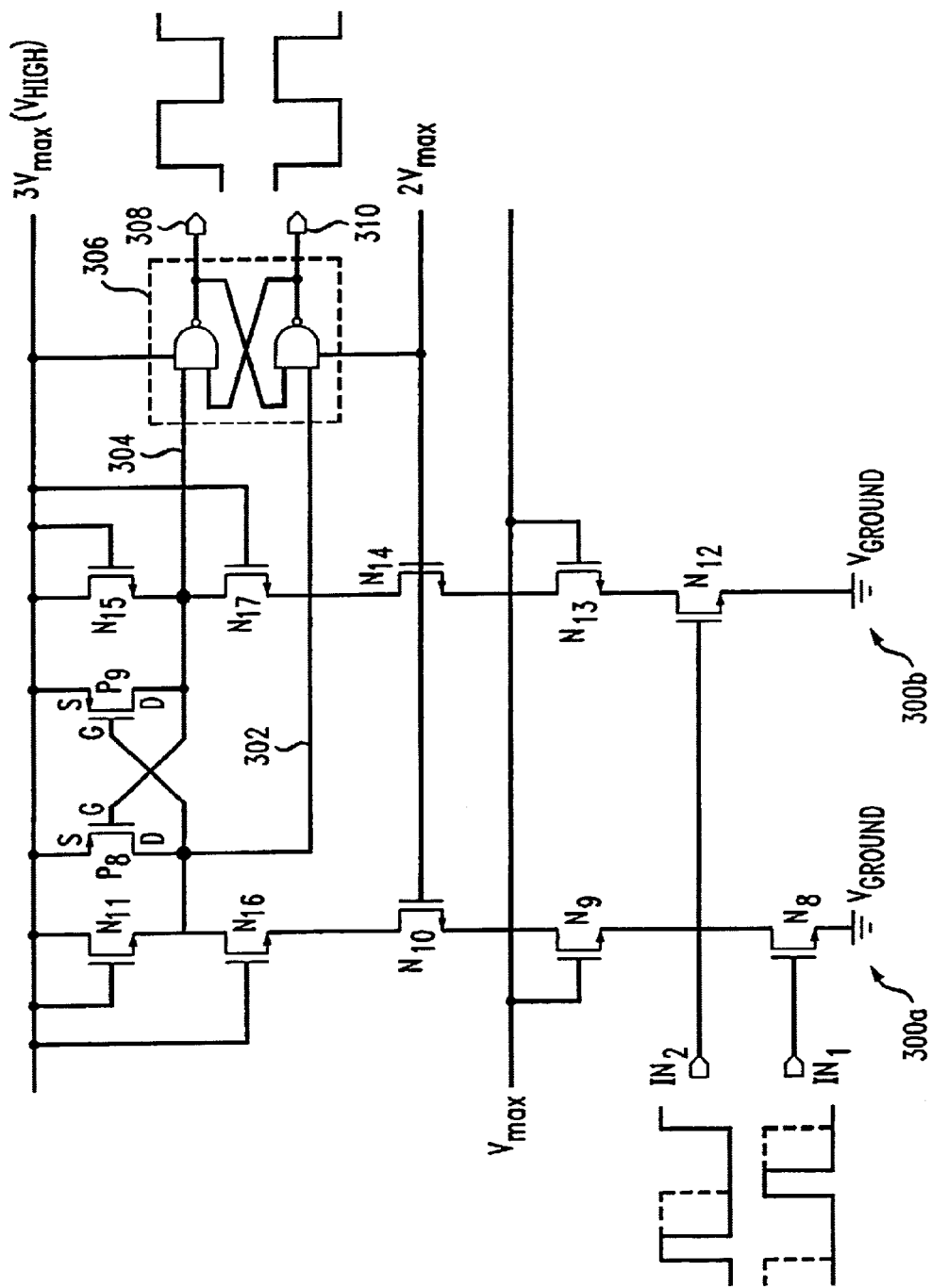
Figure 5C:
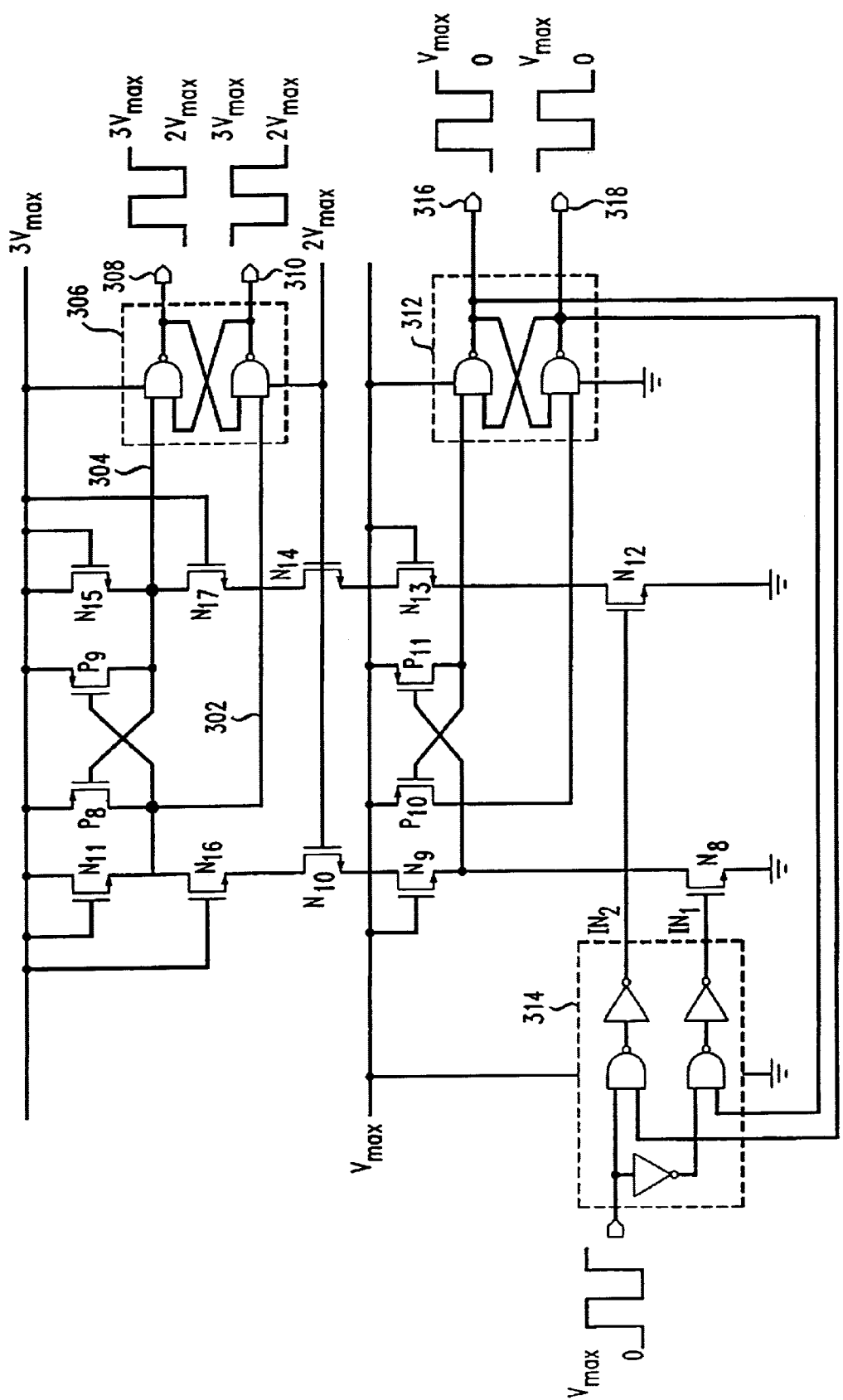

FIGS. 5A–5C are circuit schematics of an exemplary level shifter circuit 300 for use in a 3× tristate capable buffer. This circuit may be used to provide signal $V_p$ to driver 100. A level shifter circuit comprises an input n-channel transistor, a cascode stack for protecting the input transistor from voltage overstress and including at least one n-channel cascode transistor, and a load transistor coupled to the cascode stack at an output node. As shown in FIG. 5A, the level shifter 300 for providing a signal to a driver as described above may generally be illustrated as a modified N-MOS inverter comprising at least four n-channel transistors $N_8$, $N_9$, $N_{10}$ and $N_{11}$ coupled in series. A source terminal of input transistor $N_8$ is coupled to $V_{GROUND}$, a source terminal of cascode transistor $N_9$ is coupled to a drain terminal of $N_8$, a source terminal cascode transistor $N_{10}$ is coupled to a drain terminal of $N_9$ and a drain and gate terminals of load transistor $N_{11}$ are both coupled to supply $V_{HIGH}$ or $3V_{max}$. Transistors $N_{11}$ and $N_{10}$ are coupled together at first output node 302. A gate terminal of $N_8$ is coupled to an input data signal with a maximum voltage swing which does not exceed $V_{MAX}$. This input data signal may be provided by the low voltage IC. The gate terminals of $N_9$ and $N_{10}$ are coupled to a first constant voltage and a second constant voltages, respectively, such that a difference between $V_{HIGH}$ and the second constant voltage does not exceed $V_{MAX}$ and a difference between the first constant voltage and $V_{GROUND}$ does not exceed $V_{MAX}$. For a true 3× level shifter stage, the first and second constant voltages are $V_{MAX}(\frac{1}{3} V_{HIGH})$ and $2V_{max}(\frac{2}{3} V_{HIGH})$, respectively. Through the level shifter 300, a data signal $V_p$ is produced at output node 302 which corresponds to the input data signal but has a DC offset of $2V_{max}$, i.e. the signal traverses between $2V_{max}$ and $3V_{max}$ as needed for the driver circuits shown in FIGS. 3A–3F. It should be apparent that higher voltage shifted data signals may be achieved with the circuit approach of FIG. 5A by simply adding additional n-channel cascode with appropriate constant gate voltage biasing and an increased supply voltage $V_{HIGH}$.

The circuit 300 provides a very robust output signal at node 302, but can dissipate static power. To reduce this static power dissipation, the duty cycle of the input data signal can be reduced. If the input data signal duty cycle is reduced, the output duty cycle must still be preserved. Therefore, an exemplary level shifter may further include a second inverter stage driven out-of-phase with the input inverter by one half cycle and an RS (reset-set) latch connecting the two inverter stages. This exemplary embodiment of a level shifter is shown in FIG. 5B.

The level-shifter of FIG. 5B includes inverter 300a and inverter 300b ($N_{12}$, $N_{13}$, $N_{14}$, and $N_{15}$) coupled to an RS latch 306. The level shifter also optionally includes cross-coupled p-channel transistors $P_8$ and $P_9$ and added series n-channel transistors $N_{16}$ and $N_{17}$. These devices ($P_8$, $P_9$, $N_{16}$, $N_{17}$) are not required but help the level shifter produce smooth output waveforms at outputs 308 and 310. Each inverter 300a, 300b comprises an input transistor coupled to input signals $IN_1$ and $IN_2$ at their gate terminals, a cascode stack and load transistor. Input signals $IN_1$ and $IN_2$ are shown as having reduced duty cycles below 50%. The "dashed" wave forms illustrate input waveforms with 50% duty cycles. The cascode transistors provide overstress protection for all of the devices. For effective overstress protection all devices preferably are the same size. With equally sized input and load transistors, the level shifter of FIG. 5B exhibits a gain of near-unity for large signals. Inverter gain is on the first order insensitive to process and temperature variations. The level-shifter of FIG. 5B, however, dissipates static power if input signals $IN_1$ and $IN_2$ have normal duty cycles of 50% (as shown by the dashed input signals of FIG. 5B).

Since the inverter stages 300a, 300b dissipate static power whenever their inputs are "high," the static power dissipation could be reduced if the two inverters are impulse driven. Impulse duration, however, should be sufficiently large so that the latch 306 can change its state. If the two inverter structure are pulse driven, both inverter outputs are "high" most of the time. In order to be able to retain its state, the RS latch 306 should be implemented using NAND gates (as opposed to NOR gates).

The circuit of FIG. 5C illustrates one means of generating the modified pulse signals $IN_1$ and $IN_2$. The circuit of FIG. 5C also provides the additional advantage of producing two additional signals at outputs 316 and 318 having voltage swings between 0 and $V_{MAX}$. One of these signals may be used to provide signal $V_n$ to drive the n-channel transistor $N_1$ of the driver stage 100.

The desired impulse drive of FIG. 5C is realized using a "one shot" circuit. This circuit employs three MOS inverters within input circuitry 314, two NAND gates within input circuitry 314, and a NAND-based RS latch 312. Transistors $N_8$, $N_9$, $N_{12}$ and $N_{13}$ are also part of the one-shot circuit. P-channel transistors $P_{10}$ and $P_{11}$ may be included for smoother waveform generation. A pulse is produced at the gate of the transistors $N_8$ whenever there is a positive input transition and at the gate of input transistor $N_{12}$ whenever a there is a negative input transistor. The duration of the produced pulse is approximately equal to $\tau_{mos}+\tau_{N8/N9}+\tau_{RS}$ where $\tau_{mos}$ is the delay of the MOS inverter, $\tau_{N8/N9}$ is the delay of the $N_8/N_9$ inverter and $\tau_{RS}$ is the switching delay of the RS latch 312. As long as RS latch 308 and RS latch 312 are equally loaded and present minor loading to their corresponding driving circuits, the duration of the generated driving pulses would be sufficient to guarantee switching of RS latch 308.

Figure 6:
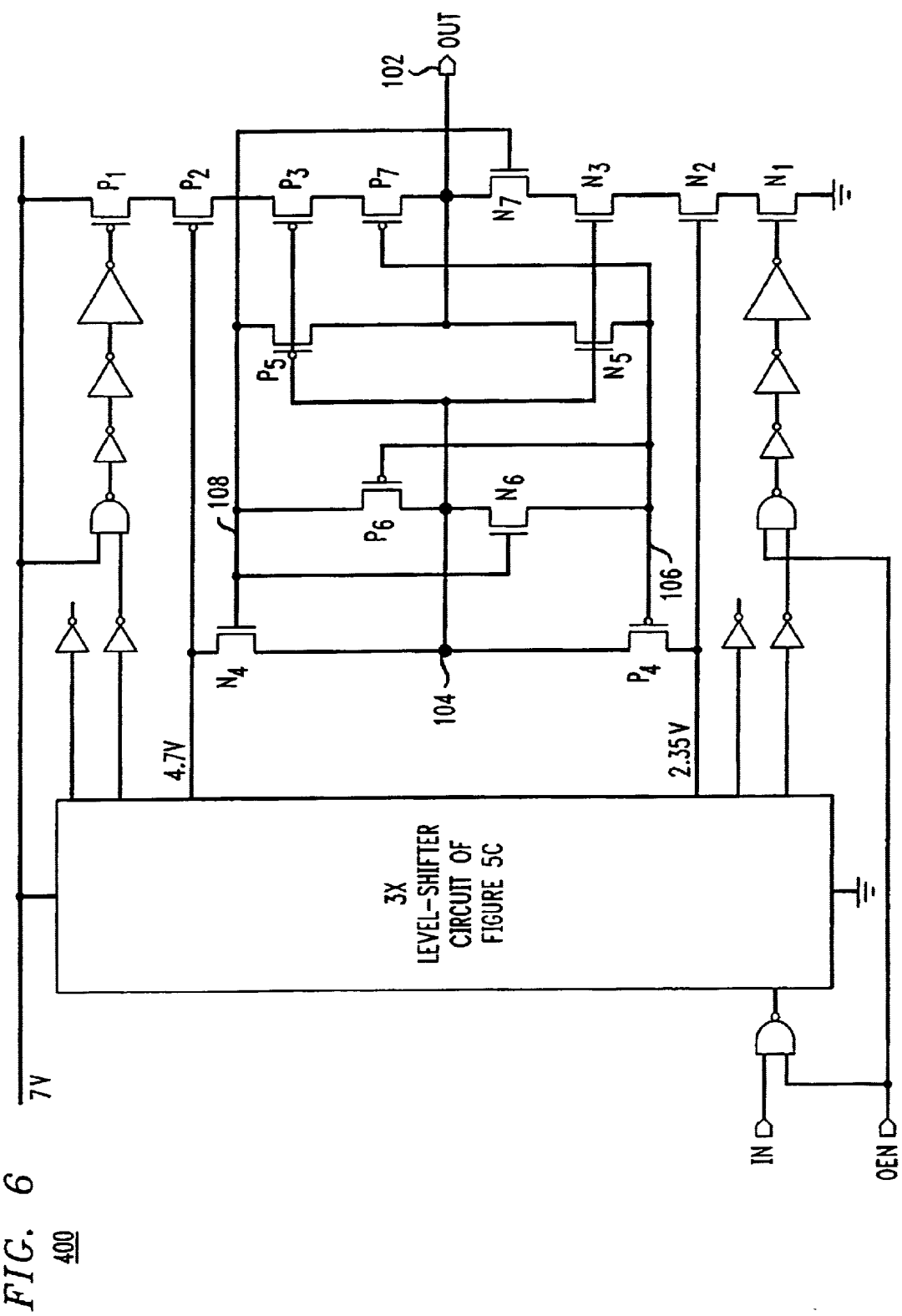
FIG. 6 is a circuit diagram of an exemplary 3× tristate capable output buffer.

FIG. 6 is an exemplary embodiment of a 3× tristate capable output buffer circuit 400 including a level shifter circuit 300 described above coupled to a driver stage 200 described above. The tristate-capable 7V output buffer 400 was fabricated with a 0.25 μm 2.5V CMOS process. The circuit was designed to drive a 10 pF load capacitance at 200MHz. The transistor sizes (width/length) in μm)) were as follows:

| $N_1$—$N_3$, $N_7$ | 370/0.24 | $P_1$—$P_3$, $P_7$ $P_7$ | 1300/0.28 |
|---|---|---|---|
| $N_5$, $N_6$ | 37/0.24 | $P_5$, $P_6$ | 74/0.28 |
| $N_4$ | 740/0.24 | $P_4$ | 1300/0.28 |
| $N_8$—$N_{17}$ | 0.6/.024 | $P_8$—$P_{11}$ | 2.1/0.28 |

The above designed circuit was tested, and "on-wafer" probing was performed successfully. To verify high-voltage capability, internal nodes 104, 106 and 108 were monitored while the buffer was operated in a "package-like environment." This was done by bonding a bare die directly on a PCB (printed circuit board) and using active probes. The obtained waveforms were then compared to the output waveform generated at node 102. The potential differences $V_{102}$–$V_{106}$, $V_{102}$–$V_{108}$ and $V_{102}$–$V_{104}$ are indicative of the presence or absence of GS and GD voltage overstress. These differences remained bounded to approximately ±2.5 V. Therefore, the voltage drive and tolerance of the developed buffer circuit is nearly three times larger than the breakdown voltage of the MOS devices used in the circuit.

Figure 3F:
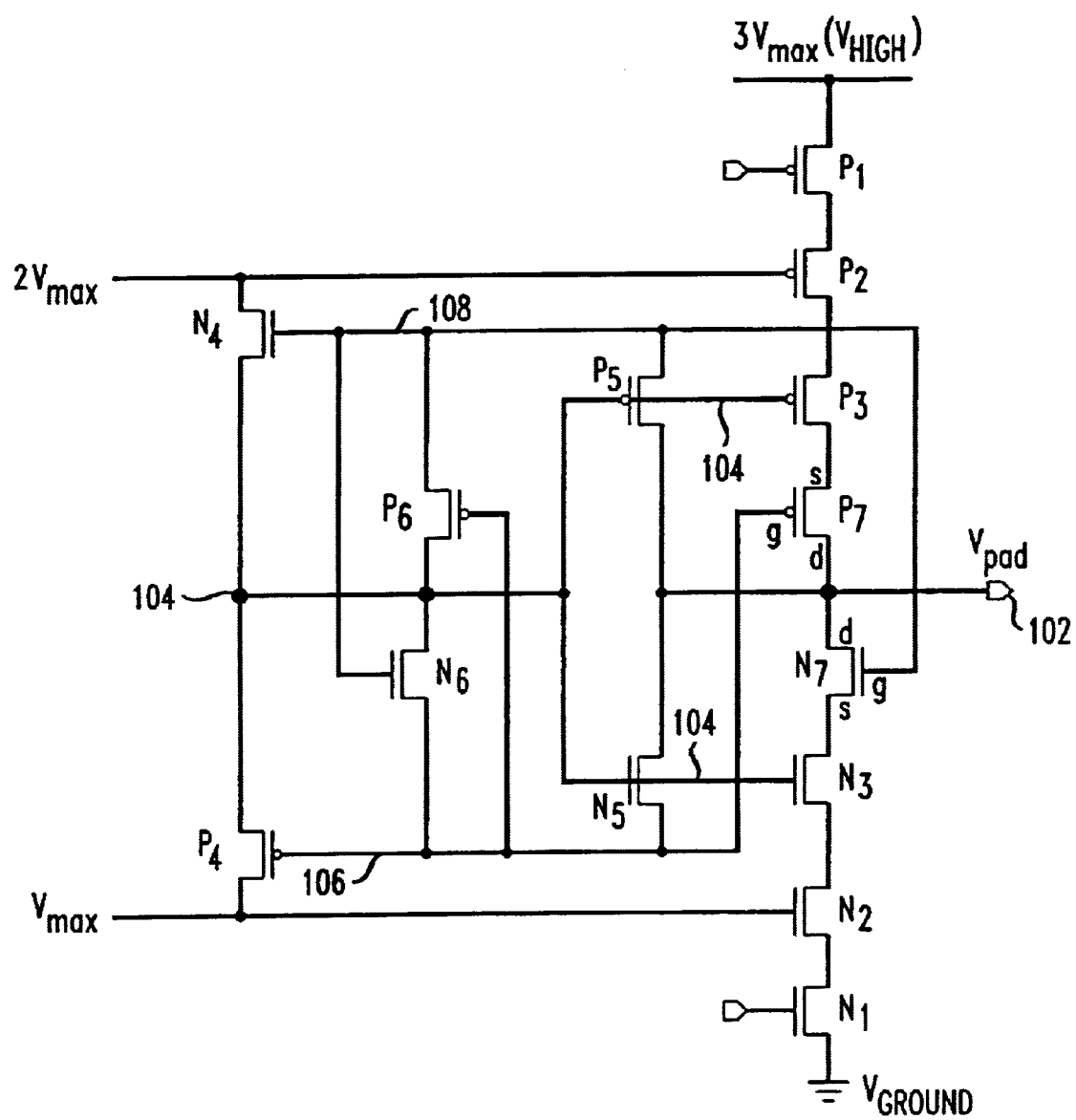
Figure 7:
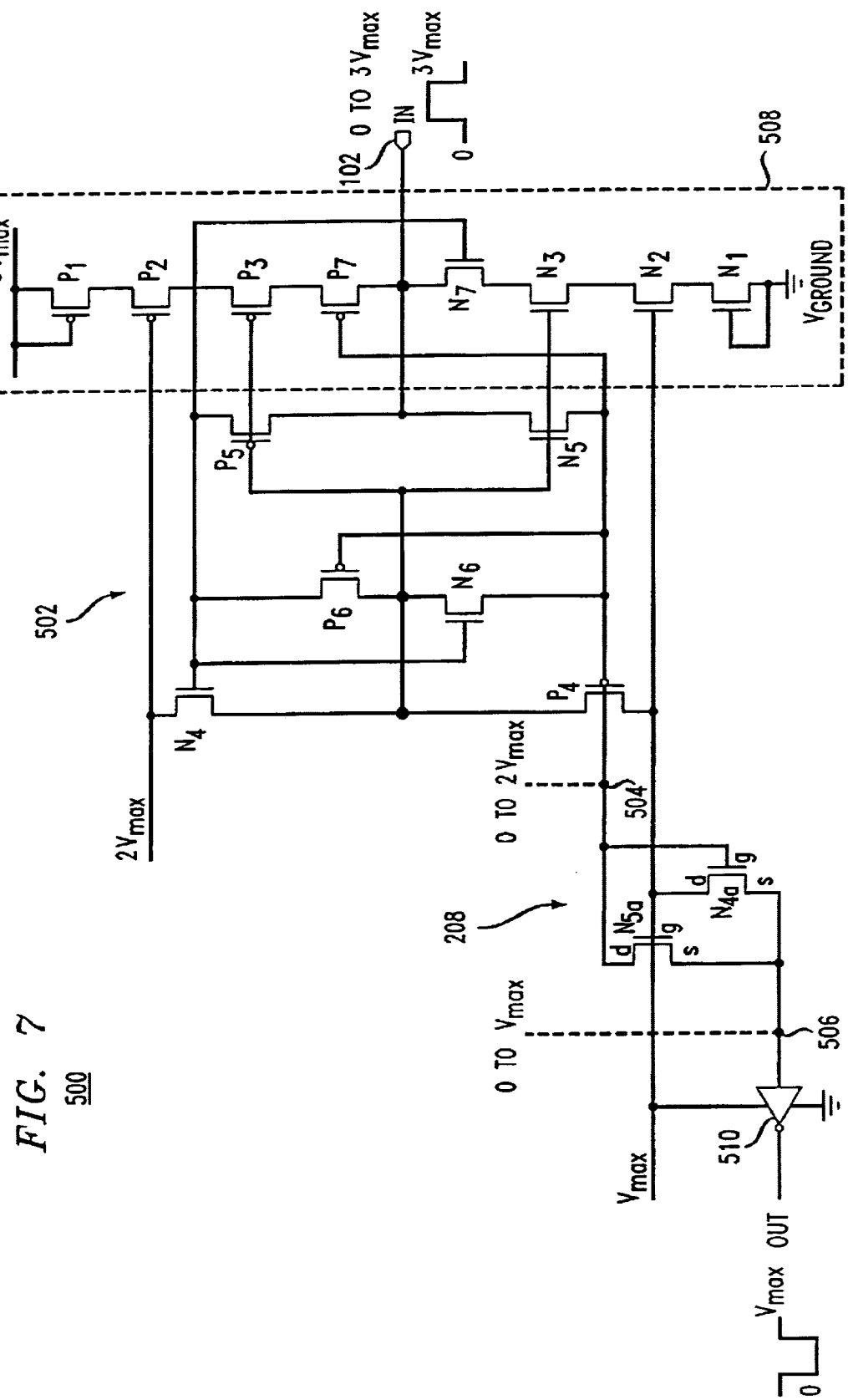
FIG. 7 is a circuit diagram of a 3× tristate capable input buffer.

FIG. 7 illustrates that the circuit approach described in FIGS. 3D–3F may be used to form an input buffer circuit which receives an input signal at node 102 which swings between 0 and 3Vmax and produces an output data which swings between 0 and $V_{MAX}$ at output node 506. Of course the output signal can be amplified by an inverter 510 or chain of inverters as is conventional. The n-channel and p-channel cascode stacks of FIGS. 3D–3F are not required for the function of an exemplary input driver. This circuitry is shown within the dashed box 508. These cascode stacks may be disenabled by coupling the gate of $P_1$ to the supply voltage and the gate of $N_1$ to $V_{GROUND}$.

An input stage 502 may be designed as shown in FIGS. 3D–3F from transistors $N_4$–$N_6$ and $P_4$–$P_6$ particularly those circuit configuration introduced in FIGS. 3D and 3E. Likewise, the biasing circuit 208 of FIG. 4 including n-channel transistors $N_{5a}$ and $N_{4a}$ may be coupled to the input stage 502 as shown. An input data signal from a high voltage IC presented at node 102 and having a voltage swing between 0 and $3V_{max}$ produces a data signal at node 506 which is appropriate for safely driving a low voltage IC. The data signal at node 504 has a voltage swing between 0 and $2V_{MAX}$, and the data signal at node 506 has a voltage swing of 0 to $V_{MAX}$.

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention.

I claim:

1. An integrated circuit comprising an output buffer having a maximum voltage that approximates the highest voltage $V_{MAX}$ applicable across at least one pair of nodes of a transistor, the output buffer for delivering an output signal having a voltage swing $V_{HIGH}$ of up to about three times the magnitude of $V_{MAX}$, said output buffer comprising:

(a) at least a first and a second transistor cascode stack, each of said stacks having a driver transistor and at least one cascode transistor; and (b) biasing circuit means for biasing said at least one cascode transistor of each of said cascode stacks in response to said output signal such that the magnitude of the voltage applicable across each pair of nodes of each transistor in each cascode stack is less than or equal to $V_{MAX}$ if said output buffer delivers an output signal having said voltage swing $V_{HIGH}$ of up to about three times the magnitude of $V_{MAX}$.

2. The integrated circuit of claim 1, wherein said biasing circuit comprises switching means for applying to a biasing node of a cascode transistor of each of said first and second cascode stacks a first voltage having a magnitude of about $V_{HIGH}$–$V_{MAX}$ if the output signal voltage is greater than or equal to about $V_{HIGH}$–$V_{MAX}$ and a second voltage having a magnitude of about $V_{HIGH-2}V_{MAX}$ if the output signal voltage is less than or equal to about $V_{HIGH-2}V_{MAX}$.

3. The integrated circuit of claim 2, wherein said first transistor cascode stack includes transistors of a first conduction type and said second cascode stack includes transistors of a second conduction type.

4. The integrated circuit of claim 3 wherein each of said at least first and second transistor cascode stacks includes at least two cascode transistors, wherein said first voltage is coupled to a biasing node of one of said cascode transistors in said first cascode stack, said second voltage is coupled to a biasing node of at least one of said cascode transistors in said second cascode stack, and wherein said switching means applies, to the biasing node of said other cascode transistor of each of said first and second cascode stacks, said first voltage if the output signal voltage is greater than or equal to about $V_{HIGH}$–$V_{MAX}$ and said second voltage if the output signal voltage is less than or equal to about $V_{HIGH}$–$V_{MAX}$.

5. The integrated circuit of claim 4, wherein said switching means comprises a fourth transistor of said second conduction type coupling said first voltage to said biasing nodes of said other cascode transistors and a fourth transistor of said first conduction type coupling said second voltage to said biasing nodes of said other cascode transistors.

6. The integrated circuit of claim 5, wherein said fourth transistors are coupled together at a first node coupled to said biasing nodes of said other transistors of said cascode stacks, said switching means further comprising a fifth transistor of said second conduction type coupling said biasing node of said fourth transistor of said first conduction type to an output node and a fifth transistor of said first conduction type coupling said biasing node of said fourth transistor of said second conduction type to said output node, said fifth transistors having respective biasing nodes coupled to said first node.

7. The integrated circuit of claim 6, further comprising a sixth transistor of said second conduction type and a sixth transistor of said first conduction type coupled between said biasing nodes of said fourth transistors at said first node, said sixth transistors having biasing nodes coupled to said output node.

8. The integrated circuit of claim 6, further comprising a sixth transistor of said second conduction type and a sixth transistor of said first conduction type coupled between said biasing nodes of said fourth transistors, wherein said sixth transistors are coupled together at said first node, and wherein a biasing terminal of said sixth transistor of said first conduction type is coupled to a biasing terminal of said fourth transistor of said first conduction type and a biasing terminal of said sixth transistor of said second conduction type is coupled to a biasing terminal of said fourth transistor of said second conduction type.

9. The integrated circuit of claim 8, wherein said first cascode stack further comprises a seventh transistor of said first conduction type coupled between said other cascode transistor of said first cascode stack and said output node, and said second cascode stack further comprises a seventh cascode transistor of said second conduction type coupled between said other cascode transistor of said second cascode stack and said output node and wherein a biasing node of said seventh transistor of said second conduction type is coupled to a biasing node of said fourth transistor of said second conduction type, and a biasing node of said seventh transistor of said first conduction type is coupled to a biasing node of said fourth transistor of said first conduction type.

10. An integrated circuit comprising a tristate capable output buffer having a maximum voltage that approximates the highest voltage $V_{MAX}$ applicable across at least one pair of nodes of a transistor, the output buffer for delivering an output signal having a voltage swing $V_{HIGH}$ of up to about three times the magnitude of $V_{MAX}$, said output buffer comprising:

(a) a voltage driver, comprising:
(i) at least a first and a second transistor cascode stack, each of said stacks having a driver transistor and at least one cascode transistor; and
(ii) biasing circuit means for biasing said at least one cascode transistor of each of said cascode stacks in response to said output signal such that the magnitude of the voltage applicable across each pair of nodes of each transistor in each cascode stack is less than or equal to $V_{MAX}$ if said output buffer delivers an output signal having said voltage swing $V_{HIGH}$ of up to about three times the magnitude of $V_{MAX}$; and
(b) a level shifter circuit, said level shifter circuit providing at least one voltage shifted data signal to a driver transistor of said voltage driver in response to an input data signal if said buffer is in an active mode, said level shifter circuit further configured to place said buffer in a tristate mode in response to an enable signal.

11. The integrated circuit of claim 10, wherein said level shifter circuit comprises:
a first inverter for providing a first voltage shifted data signal comprising at least an input transistor having a biasing node for receiving a first input data signal, a cascode stack connected in series with said input transistor and a load transistor.

12. The integrated circuit of claim 11, wherein said level shifter further comprises:
a second inverter for providing a second voltage shifted data signal comprising at least an input transistor having a biasing node for receiving a second input data signal, a cascode stack connected in series with said input transistor and a load transistor; and
a first latch for producing said at least one voltage shifted data signal in response to said first and second voltage shifted data signals if said input transistors of said inverters are driven with a first and second modified input data signals, respectively, corresponding to said input data signal with a reduced duty cycle.

13. The integrated circuit of claim 12, wherein said latch is a RS latch and said level shifter further comprises a one-shot circuit for generating said first and second modified input data signals.

14. The integrated circuit of claim 12, wherein said biasing circuit comprises switching means for applying to a biasing node of a cascode transistor of each of said first and second cascode stacks a first voltage having a magnitude of about $V_{HIGH}-V_{MAX}$ when if the output signal voltage is greater than or equal to about $V_{HIGH}-V_{MAX}$ and a second voltage having a magnitude of about $V_{HIGH-2}V_{MAX}$ if the output signal voltage is less than or equal to about $V_{HIGH-2}V_{MAX}$.

15. The integrated circuit of claim 14, wherein said first transistor cascode stack includes transistors of a first conduction type and said second cascode stack includes transistors of a second conduction type.

16. The integrated circuit of claim 15 wherein each of said at least first and second transistor cascode stacks includes at least two cascode transistors, wherein said first voltage is coupled to a biasing node of one of said cascode transistors in said first cascode stack, said second voltage is coupled to a biasing node of at least one of said cascode transistors in said second cascode stack, and wherein said switching means applies, to the biasing node of said other cascode transistor of each of said first and second cascode stacks, said first voltage if the output signal voltage is greater than or equal to about $V_{HIGH}-V_{MAX}$ and said second voltage when if the output signal voltage is less than or equal to about $V_{HIGH}-V_{MAX}$.

17. The integrated circuit of claim 16, wherein said switching means comprises a fourth transistor of said second conduction type coupling said first voltage to said biasing nodes of said other cascode transistors and a fourth transistor of said first conduction type coupling said second voltage to said biasing nodes of said other cascode transistors.

18. The integrated circuit of claim 17, wherein said fourth transistors are coupled together at a first node coupled to said biasing nodes of said other transistors of said cascode stacks, said switching means further comprising a fifth transistor of said second conduction type coupling said biasing node of said fourth transistor of said first conduction type to an output node and a fifth transistor of said first conduction type coupling said biasing node of said fourth transistor of said second conduction type to said output node, said fifth transistors having respective biasing nodes coupled to said first node.

19. The integrated circuit of claim 18, further comprising a sixth transistor of said second conduction type and a sixth transistor of said first conduction type coupled between biasing nodes of said fourth transistors at said first node, said sixth transistors having biasing nodes coupled to said output node.

20. The integrated circuit of claim 18, further comprising a sixth transistor of said second conduction type and a sixth transistor of said first conduction type coupled between biasing nodes of said fourth transistors, wherein said sixth transistors are coupled together at said first node, and wherein a biasing terminal of said sixth transistor of said first conduction type is coupled to a biasing terminal of said fourth transistor of said first conduction type and a biasing terminal of said sixth transistor of said second conduction type is coupled to a biasing terminal of said fourth transistor of said second conduction type.

21. The integrated circuit of claim 20, wherein said first cascode stack further comprises a seventh transistor of said first conduction type coupled between said other cascode transistor of said first cascode stack and said output node, and said second cascode stack further comprises a seventh cascode transistor of said second conduction type coupled between said other cascode transistor of said second cascode stack and said output node and wherein a biasing node of said seventh transistor of said second conduction type is coupled to a biasing node of said fourth transistor of said second conduction type, and a biasing node of said seventh transistor of said first conduction type is coupled to a biasing node of said fourth transistor of said first conduction type.

* * * * *